(12) United States Patent
Hosono et al.

(10) Patent No.: US 9,190,152 B2
(45) Date of Patent: Nov. 17, 2015

(54) SEMICONDUCTOR MEMORY DEVICE

(71) Applicant: KABUSHIKI KAISHA TOSHIBA, Tokyo (JP)

(72) Inventors: Koji Hosono, Kanagawa (JP); Tomonori Kurosawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 75 days.

(21) Appl. No.: 14/189,979

(22) Filed: Feb. 25, 2014

(65) Prior Publication Data
US 2015/0070994 A1  Mar. 12, 2015

(30) Foreign Application Priority Data
Sep. 6, 2013 (JP) ................ 2013-185776

(51) Int. Cl.
*G11C 16/04* (2006.01)
*G11C 16/08* (2006.01)
*G11C 8/12* (2006.01)
*G11C 8/10* (2006.01)
*G11C 8/08* (2006.01)

(52) U.S. Cl.
CPC  *G11C 16/08* (2013.01); *G11C 8/08* (2013.01); *G11C 8/10* (2013.01); *G11C 8/12* (2013.01)

(58) Field of Classification Search
CPC ............ G11C 16/08; G11C 8/08; G11C 8/10; G11C 8/12

USPC ............ 365/185.09, 185.11, 185.22, 185.23, 365/230.03, 230.04, 230.06
See application file for complete search history.

(56) References Cited

U.S. PATENT DOCUMENTS

| 4,597,064 | A  | * | 6/1986  | Giebel ...................... 365/185.13 |
| 5,818,756 | A  | * | 10/1998 | Sakui et al. .............. 365/185.17 |
| 8,625,382 | B2 | * | 1/2014  | Hendrickson ............ 365/230.06 |
| 9,013,914 | B2 | * | 4/2015  | Ozawa ......................... 365/154 |
| 9,053,765 | B2 | * | 6/2015  | Fukano ............................... 1/1 |
| 2009/0267128 | A1 | | 10/2009 | Maejima |
| 2009/0268522 | A1 | | 10/2009 | Maejima |
| 2010/0207195 | A1 | | 8/2010  | Fukuzumi et al. |
| 2011/0284946 | A1 | | 11/2011 | Kiyotoshi |

FOREIGN PATENT DOCUMENTS

JP  2012-069695 A  4/2012

* cited by examiner

*Primary Examiner* — Gene Auduong
(74) *Attorney, Agent, or Firm* — Patterson & Sheridan, LLP

(57) ABSTRACT

A memory device includes a plurality of memory blocks, and a row decoder including a plurality of decoders including a first decoder and a second decoder, the first decoder being configured to output a first block selection signal for selecting one of the memory blocks and a control signal for causing the second decoder to output a second block selection signal for selecting another one of the memory blocks.

20 Claims, 13 Drawing Sheets

SEMICONDUCTOR MEMORY DEVICE

CROSS-REFERENCE TO RELATED APPLICATION

This application is based upon and claims the benefit of priority from Japanese Patent Application No. 2013-185776, filed Sep. 6, 2013, the entire contents of which are incorporated herein by reference.

FIELD

Embodiments described herein relate generally to a semiconductor memory device.

BACKGROUND

NAND type flash memories having a three dimensional structure, which are manufactured by using a manufacturing process known as BiCS technology, are known in the art.

DETAILED DESCRIPTION

Figure 1:
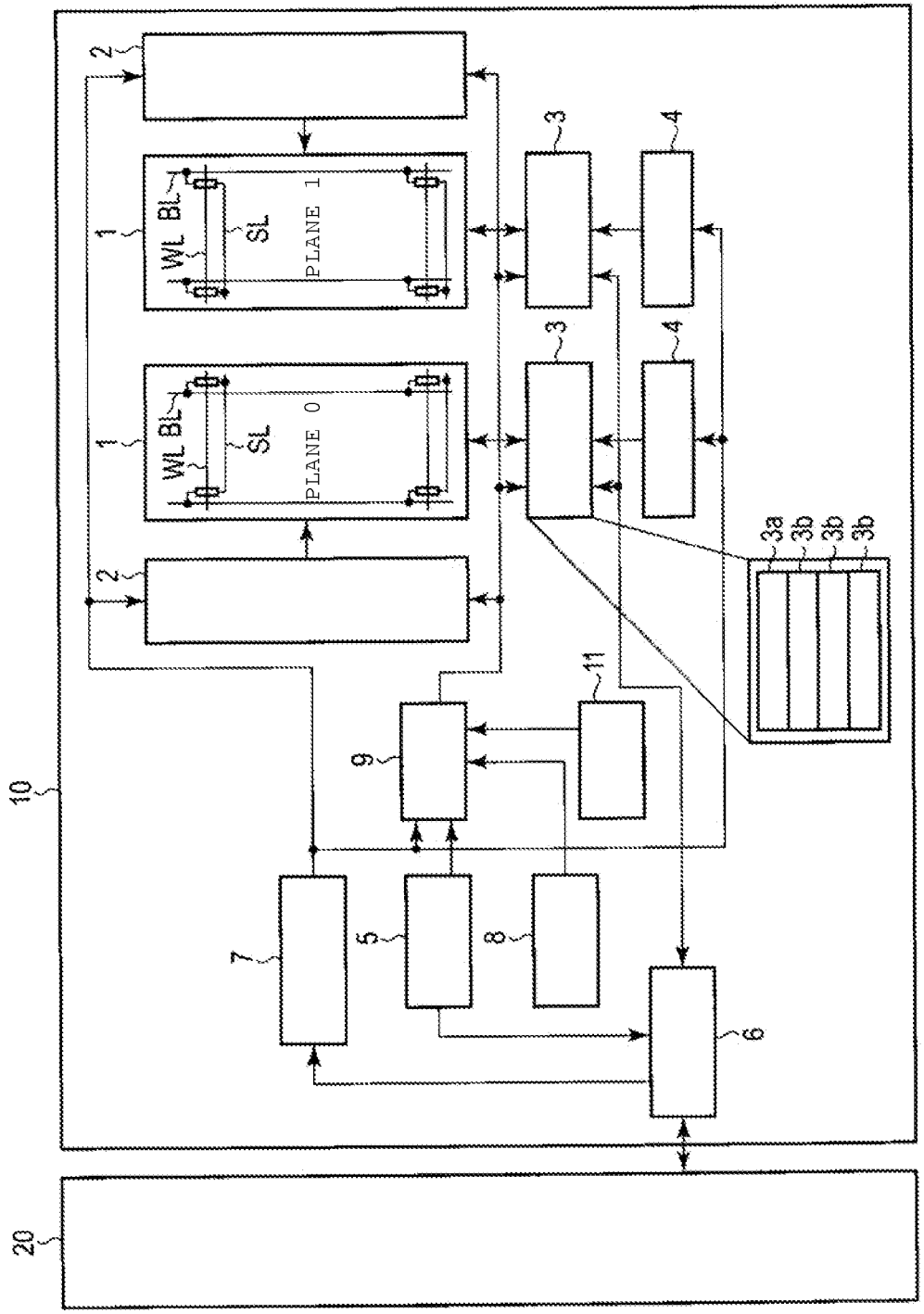
FIG. 1 is a block diagram of a semiconductor memory device according to a first embodiment.

Embodiments provide a semiconductor memory device capable of detecting a leakage current more easily.

In general, according to one embodiment, a memory device includes a plurality of memory blocks, and a row decoder including a plurality of decoders including a first decoder and a second decoder, the first decoder being configured to output a first block selection signal for selecting one of the memory blocks and a control signal for causing the second decoder to output a second block selection signal for selecting another one of the memory blocks.

Embodiments will be described below with reference to drawings. In addition, in the following description, components having substantially the same functions and configurations are denoted by the same reference symbols, and the description thereof will be made as needed. Further, in some cases, some components are referred to in the following description but are not shown in the drawings. That is because it is hard to show all components in the drawings.

First Embodiment

FIG. 1 is a block diagram of a semiconductor memory device 10 according to a first embodiment. FIG. 1 shows also a memory controller 20 in communication with the semiconductor memory device 10. Each functional block can be realized as either one of hardware and computer software or a combination thereof. Therefore, each functional block will be described below generally in terms of its functionality and each functional block may be any one of hardware and computer software or a combination thereof. Further, it is not essential for each functional block to be a separate component in the following example. For example, some functions may be performed by functional blocks other than exemplary functional blocks. Further, the exemplary functional block may be further divided into smaller functional sub-blocks.

The semiconductor memory device 10 includes components such as memory cell arrays 1, row decoders 2, data circuit-page buffer 3, column decoders 4, a control circuit 5, an input/output circuit 6, an address-command register 7, a voltage generation circuit 8, a core driver 9, a leakage detection circuit 11, and the like.

The semiconductor memory device 10 includes a plurality of memory cell arrays 1 (two memory cell arrays are shown). The memory cell arrays 1 may be referred to as planes. Each memory cell array 1 includes a plurality of (for example, m+1) memory blocks (physical blocks). Each memory block includes a plurality of memory cells, a word line WL, a bit line BL, a source line SL and the like.

A set including the row decoder 2, the data circuit-page buffer 3, and the column decoder 4 is provided for each memory cell array 1. The row decoder 2 receives a block address signal and the like from the address-command register 7, and receives a word line control signal and a selection gate line control signal from the core driver 9. The row decoder 2 selects a memory block, a word line, and the like, based on the block address signal, the word line control signal and the selection gate line control signal, which are received.

The data circuit-page buffer 3 temporarily holds data which is read from the memory cell array 1, receives write data from the outside of the semiconductor memory device 10, and writes the received data in the selected memory cell. The data circuit-page buffer 3 includes a sense amplifier 3a. The sense amplifier 3a includes a plurality of sense amplifier units each of which is connected to a plurality of bit lines BL, reads data of the memory cell inside the memory cell array 1 through the bit line BL and detects the state of the memory cell through the bit line. The semiconductor memory device 10 can hold data of two or more bits in one memory cell. Therefore, the data circuit-page buffer 3 includes, for example, three data caches 3b. A first data cache 3b holds one of lower page data and upper page data, and a second data cache 3b holds the other of the lower page data and the upper page data. The lower page data includes a set of lower-order bits of the two bit data of the associated plurality of memory cells. The upper page data includes a set of upper-order bits of the two bit data of the associated plurality of memory cells. A third data cache 3b holds temporary data to be rewritten in the memory cell based on the result of verify read.

The column decoder 4 receives a column address signal from the address-command register 7, and decodes the received column address signal. The column decoder 4 controls the input/output of the data of the data circuit-page buffer 3, based on the decoded address signal.

The control circuit 5 receives a command to instruct reading, writing, or erasing from the address-command register 7. The control circuit 5 controls the voltage generation circuit 8 and the core driver 9 in response to a predetermined sequence based on the command. The voltage generation circuit 8 generates various voltages in response to the instruction of the control circuit 5. The core driver 9 controls the row decoder 2 and the data circuit-page buffer 3 in order to control the word line WL and the bit line BL in response to the instruction of the control circuit 5. The input/output circuit 6 controls the input from the memory controller 20 or the output to the memory controller 20, including a command, an address, and data. The leakage detection circuit 11 detects leakage current in the memory cell array 1, and will be described in detail later.

Figure 2:
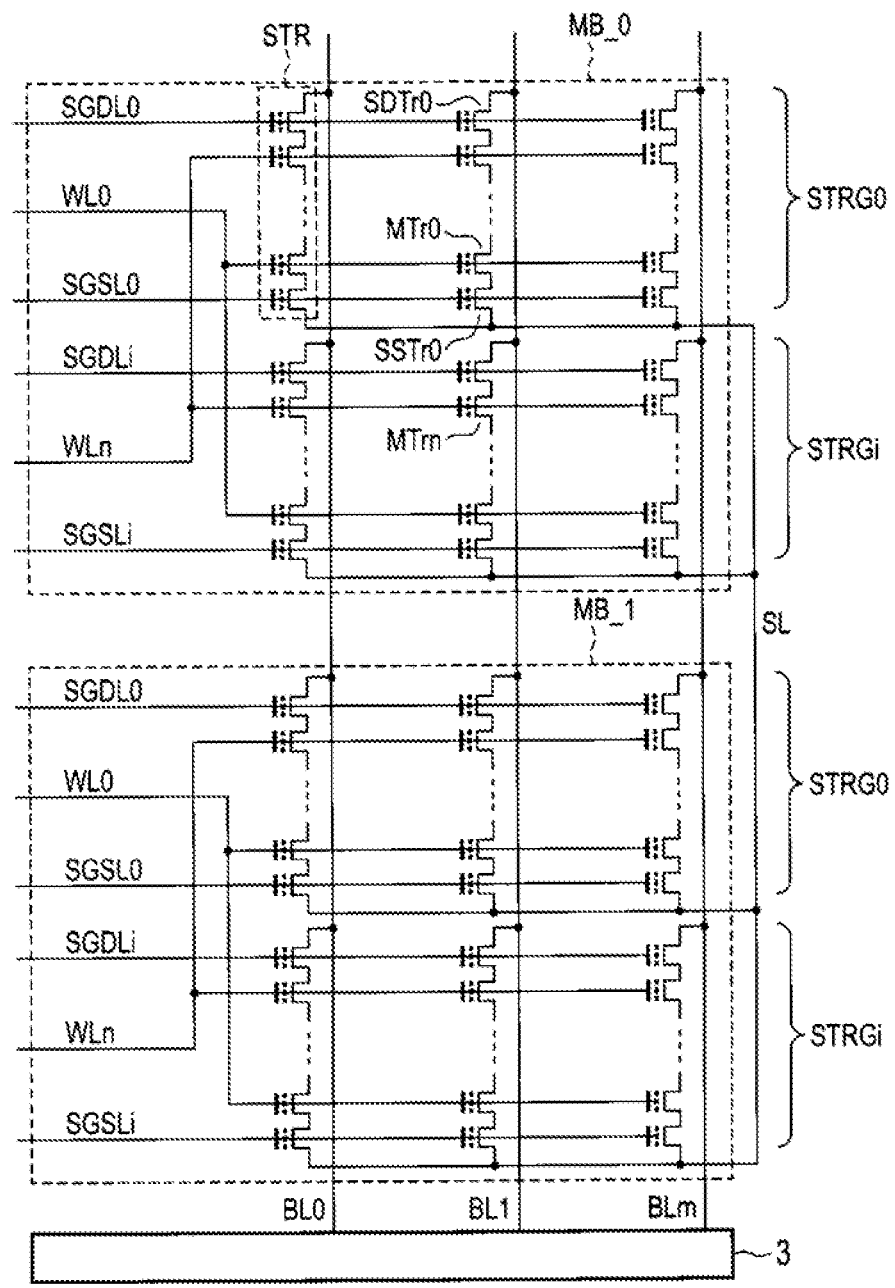
FIG. 2 is a circuit diagram of a portion of a memory cell array according to the first embodiment.

The memory cell array 1 has the elements and connections shown in FIG. 2. FIG. 2 is a circuit diagram of a portion (two memory blocks MB) of the memory cell array according to the first embodiment. As shown in FIG. 2, the memory cell array 1 includes a plurality of bit lines BL, a source (cell source) line SL, and a plurality of memory blocks MB. In each memory block MB, i+1 strings STR are connected to one bit line BL.

One string STR has n+1 (for example, n is 15) memory cell transistors MTr0 to MTr15 that are connected in series, a source-side selection gate transistor SSTr, and a drain-side selection gate transistor SDTr. The following description is based on an example in which one string STR includes 16 cell transistors MTr. When it is not necessary to distinguish between the elements with the number at the end of the reference symbols (for example, cell transistor MTr), the reference symbols are used without the number at the end thereof.

In each string STR, the drain of the transistor SSTr is connected to the source of the cell transistor MTr0. The source of the transistor SDTr is connected to the drain of the cell transistor MTr15. The source of the transistor SSTr is connected to the source line SL. The drain of the transistor SDTr is connected to the corresponding one bit line BL.

A plurality of strings STR that are arranged along the direction of extension of the word line WL constitute a string group STRG. For example, all of the plurality of strings STRs, arranged along the direction of extension of the word line WL, each of which is connected to all bit lines BL constitute a single string group STRG. In each string group STRG, each gate of each of the cell transistors MTr0 of the plurality of strings STRs is commonly connected to the word line WL0. Similarly, in each string group STRG, each gate of each of the cell transistors MTrX of the plurality of strings STRs is commonly connected to the word line WLX.

In each string group STRG, each gate of each of the cell transistors SDTr of the plurality of strings STRs is commonly connected to the drain-side selection gate line SGDL. The selection gate lines SGDL0 to SGDLi are respectively provided for the string groups STRG0 to STRGi.

In each string group STRG, each gate of each of the transistors SSTr of the plurality of strings STRs is commonly connected to the source-side selection gate line SGSL. The source-side selection gate lines SGSL0 to SGSLi are respectively provided for the string groups STRG0 to STRGi.

The structure of the memory cell array 1 is described, for example, in U.S. patent application Ser. No. 12/407,403 entitled "Three dimensional stacked nonvolatile semiconductor memory", filed on Mar. 19, 2009. Further, it is described in U.S. patent application Ser. No. 12/406,524 entitled "Three dimensional stacked nonvolatile semiconductor memory", filed on Mar. 18, 2009, U.S. patent application Ser. No. 12/679,991 entitled "Non-volatile semiconductor storage device and method of manufacturing the same", filed on Mar. 25, 2010, and U.S. patent application Ser. No. 12/532,030 entitled "Semiconductor memory and method for manufacturing same", filed on Mar. 23, 2009. These patent applications are incorporated herein by reference in their entirety.

A plurality of cell transistors MTr of one string group STRG which are connected to the same word line WL, constitute a physical unit. The storage space of one physical unit constitutes one or more pages. One page may be configured with the storage spaces of some of the cell transistors MTr of the physical unit. Data is read in page units. Data may be written in page units or physical units.

In each memory block MB, the word lines WL of the same number that are connected to memory cell transistors MTr of different strings STR, are connected with each other. In other words, for example, in all strings in one memory block MB, the word lines WL0 are connected with each other and the word lines WLX are connected with each other.

For the access to the cell transistor MTr, one memory block MB is selected, and one string group STRG is selected. For the selection of the memory block MB, a signal for selecting the memory block MB is supplied only to the memory block MB specified by a block address signal. In the selected memory block MB, the word line WL, and the selection gate lines SGSL and SGDL are connected to a driver in the core driver 9.

Further, for the selection of one string group STRG, the selection gate transistors SSTr and SDTr of only the selected string group STRG receive a selection voltage. In the non-selected string group STRG, the selection gate transistors SSTr and SDTr receive a non-selection voltage. The selection voltage depends on the operations such as reading and writing. Similarly, the non-selection voltage also depends on the operations such as reading and writing.

The word line WL and the selection gate lines SGSL and SGDL are controlled, for example, at each of the memory blocks MB of even numbers (MB_0, MB_2, MB_4, . . . ) and of the memory blocks MB of odd numbers (MB_1, MB_3, MB_5, . . . ). In other words, the word line WL0 of each memory block MB of an even number is connected to CG0_G0 for even numbers through each transfer transistor. Similarly, the word line WLX of each memory block MB of an even number is connected to CGX_G0 for even numbers through each transfer transistor. Further, the word line WL0 of each memory block MB of an odd number is connected to CG0_G1 for odd numbers through each transfer transistor. Similarly, the word line WLX of each memory block MB of an odd number is connected to CGX_G1 for odd numbers through each transfer transistor. The connections are illustrated in the drawings.

It is intended that a word line WL of a certain memory block MB be independent from a word line WL of another memory block MB. However, depending on the structure of the memory cell array 1, two memory blocks may be located so as to be adjacent, and therefore, word lines WL belonging to separate memory blocks MB are lined up physically. The word lines WL belonging to separate memory blocks MB may be in contact with each other due to a manufacturing defect and the like. Since such a short causes a leakage current and interferes with the normal operation of the semiconductor memory device 10, a leakage current needs to be detected in an inspection step or the like of the semiconductor memory device 10. A similar phenomenon may occur in the selection gate lines SGSL and SGDL.

Figure 3:
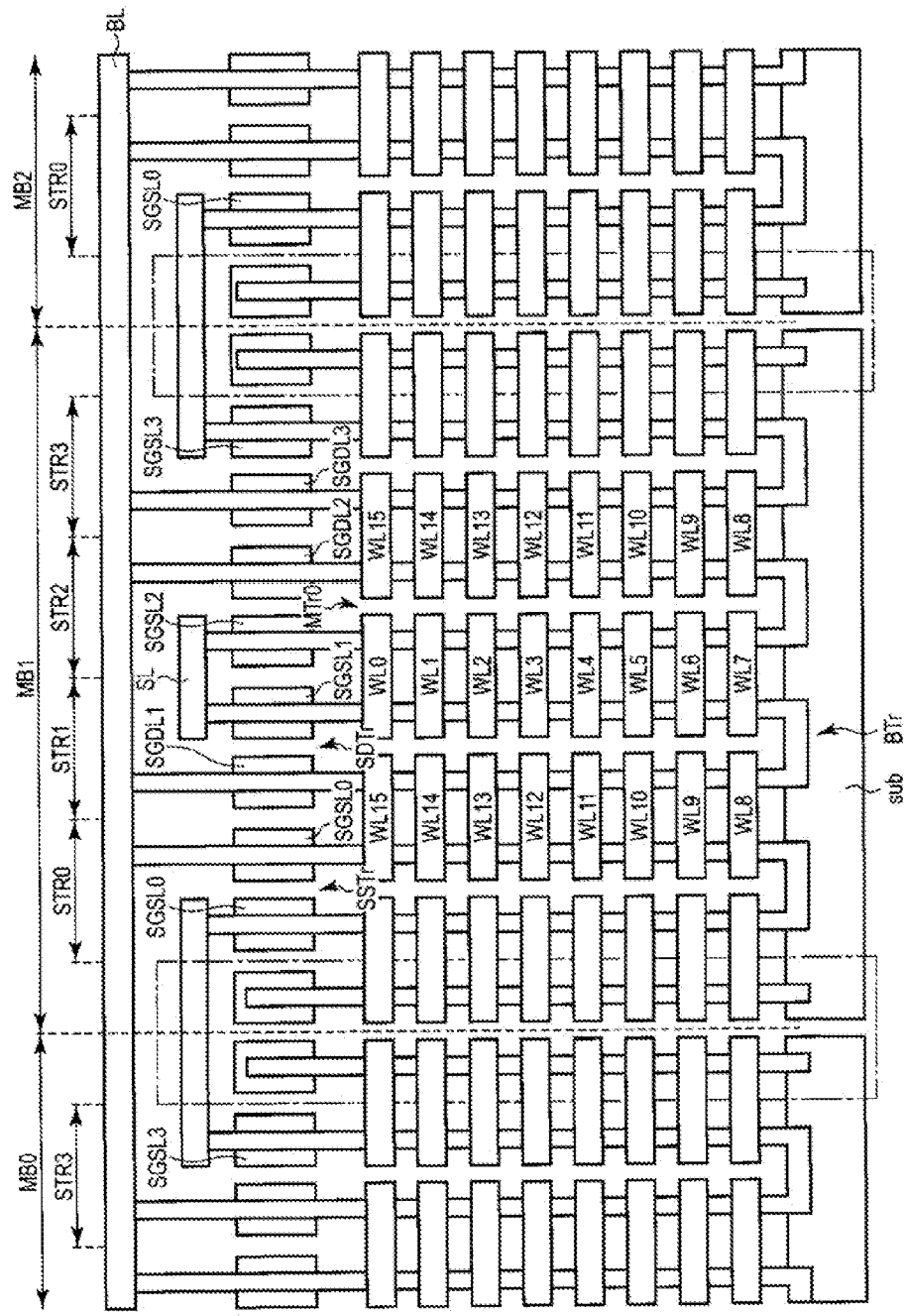
FIG. 3 is a cross-sectional view of an exemplary structure of the semiconductor memory device of FIGS. 1 and 2.

FIG. 3 shows an example of the memory cell array 1 having a structure in which the word line WL and the selection gate lines SGSL and SGDL, which belong to different memory blocks MB, are lined up physically, and shows an exemplary structure of the semiconductor memory device of FIGS. 1 and 2. FIG. 3 shows only an element associated with one bit line BL. The semiconductor memory device 10 can have a structure shown in FIG. 3.

As shown in FIG. 3, in each string, the word lines WL0 to WL7 are arranged in the direction approaching a substrate sub in this order, and the word lines WL8 to WL15 along the direction away from the substrate sub in this order. Moreover, in each string STR, the selection gate lines SGSL and SGDL are respectively located above the top word lines WL0 and WL15. The element indicated by a reference symbol SP is a semiconductor pillar. The semiconductor pillar passes through a set of the selection gate line SGSL and the word lines WL0 to WL7 or a set of selection gate line SGDL and the word lines WL8 to 15. The semiconductor pillar SP includes an insulating film in a hole penetrating the word line WL and a semiconductor material filling the hole through the insulating film. The cell transistor MTr0 is configured at the intersection of the word line WL0 and the semiconductor pillar SP. Similarly, the cell transistor MTrX is configured at the intersection of the word line WLX and the semiconductor pillar SP. Further, the selection gate transistor SSTr is configured at the intersection of the selection gate line SGSL and the semiconductor pillar SP. The selection gate transistor SDTr is configured at the intersection of the selection gate line SGDL and the semiconductor pillar SP. In each string STR, the bottom cell transistors MTr7 and MTr8 are connected by a back gate transistor BTr. A dummy word line WLDS or WLDD is provided between the top word line WL0 or WL15 and the selection gate line SGSL or SGDL.

Reference numerals SGSLY and SGDLY in FIG. 3 respectively denote the selection gate lines SGSL and SGDL of the string STRY. For the sake of simplicity, FIG. 3 shows an example in which one block includes four strings STRs (that is, i=3). The following description is also based on this example.

In the boundary of the memory block MB (enclosed by a dashed line), it is necessary to inspect for the presence or absence of a short between pairs of the word lines WL adjacent across the boundary. For this inspection, a potential difference is generated between the pairs of word lines, and a certain amount of leakage current flowing therebetween is detected. For this purpose, it is desirable that the memory block MB adjacent to the memory block MB that is selected by the block address signal for selecting a memory block MB during normal reading or writing, also be selected.

Figure 4:
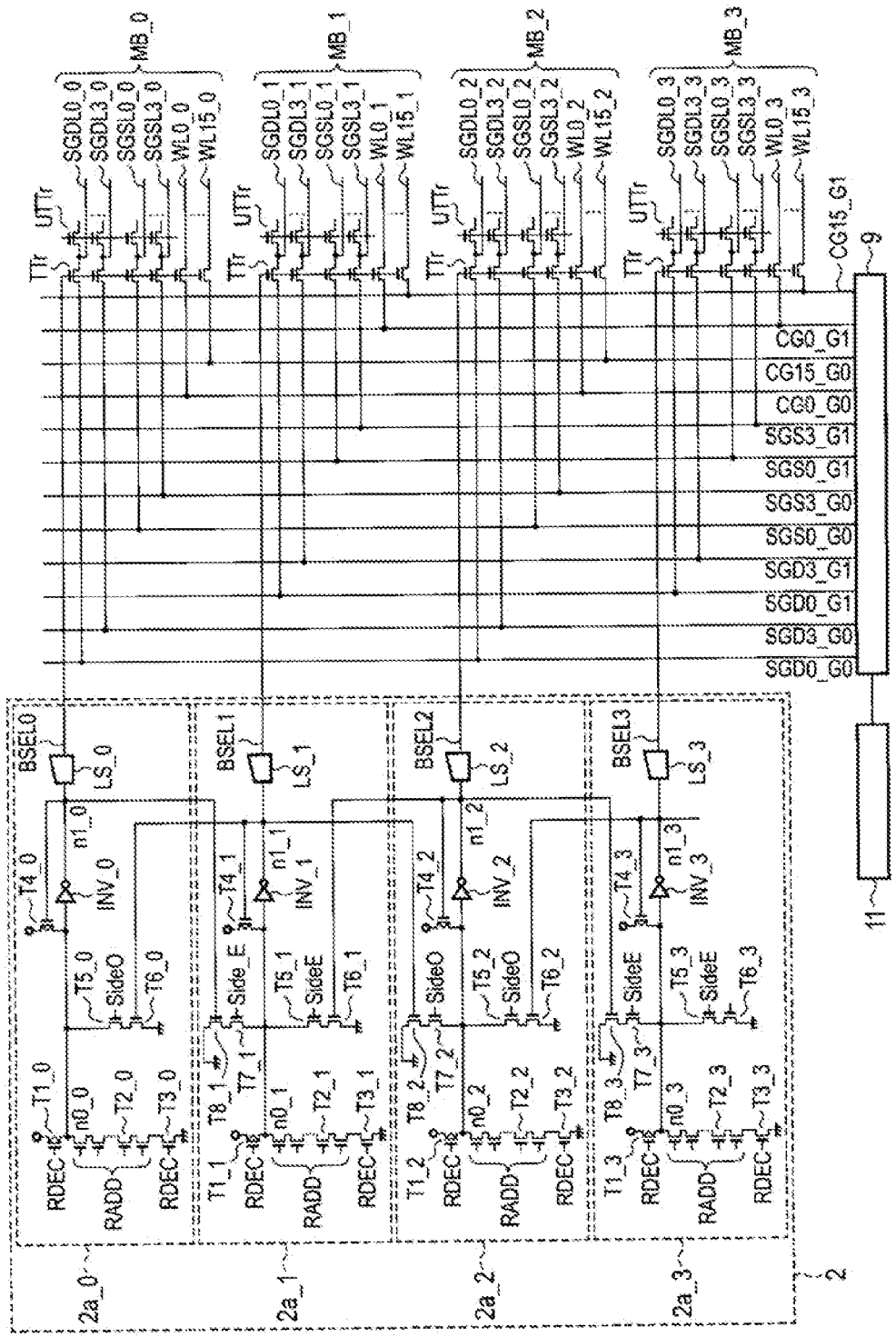
FIG. 4 is a circuit diagram of a portion of the semiconductor memory device according to the first embodiment.

FIG. 4 is a circuit diagram of a portion of the semiconductor memory device according to the first embodiment. Specifically, FIG. 4 shows a portion of the memory cell array 1, a portion of the row decoder 2, and associated functional blocks. In FIG. 4 and the following figures, in order to distinguish some signals and wirings for each memory block, the number of the memory block MB together with an underscore is attached to the end of the signals and wirings. For example, the element attached with the reference numeral SGDL0_0 denotes the selection gate line SGDL0 of the memory block MB_0.

As described above and shown in FIG. 4, CG lines CG0_G0 to CG15_G0 for the memory blocks MB of even numbers are provided and CG lines CG0_G1 to CG15_G1 for the memory blocks MB of odd numbers are provided. The word line WLX of each of the memory blocks MB of even numbers is connected to the CG line CGX_G0 through its own transfer transistor TTr. Further, the word line WLX of each of the memory blocks MB of odd numbers is connected to the CG line CGX_G1 through its own transfer transistor TTr. The number of CG lines CG0_G0 to CG15_G0 and the number of CG lines CG0_G1 to CG15_G1 are the same as the number of the cell transistors MTr in one string STR.

The selection gate line SGSLX of each of the memory blocks MB of even numbers is connected to the SGS line SGSX_G0 through its own transfer transistor TTr. The selection gate line SGSLX of each of the memory blocks MB of odd numbers is connected to the SGS line SGSX_G1 through its own transfer transistor TTr. Further, each selection gate line SGSL of each memory block MB receives a voltage Vusg for non-selection (for example, common potential) through its own transfer transistor UTTr.

The selection gate line SGDLX of each of the memory blocks MB of odd numbers is connected to the SGD line SGDX_G1 through its own transfer transistor TTr. The selection gate line SGDLX of each of the memory blocks MB of odd numbers is connected to the SGD line SGDX_G1 through its own transfer transistor TTr. Further, each selection gate line SGDL of each memory block MB receives a voltage for non-selection through its own transfer transistor UTTr.

All transfer transistors TTr of the memory block MB_0 receive the block selection signal BSEL0 in the gate thereof. Similarly, all transfer transistors TTr of the memory block MB_Y receive the block selection signal BSELY in the gate thereof. The transfer transistor TTr, which has received the block selection signal BSEL of a high level, is turned on, and thus the block memory block MB is selected. On the other hand, in the non-selected memory block MB, the selection gate lines SGSL and SGDL receive the non-selection voltage through the transfer transistor UTTr which is turned on.

The CG lines CG0_G0 to CG15_G0 and CG0_G1 to CG15_G1, the SGS lines SGS0_G0 to SGS3_G0 and SGS0_G1 to SGS3_G1, and the SGD lines SGD0_G0 to SGD3_G0 and SGD0_G1 to SGD3_G1 receive various voltages from the core driver 9. For example, the CG lines CG0 to CG15 for one of the even number groups and the odd number groups, to which the number of the selected memory block MB belongs, receive various voltages of different sizes that are determined based on the operation (reading, writing, or erasing) for the selected memory block MB and which word line WL is selected. Similarly, the SGS line SGS and the SGD line SGD for one of the even number groups and the odd number groups, to which the number of the selected memory block MB belongs, receive various voltages that are determined based on the operation and which string STR is selected. The potentials of the CG lines CG0_G0 to CG15_G0 and CG0_1 to CG15_1, the SGS lines SGS0_G0 to SGS3_G0 and SGS0_G1 to SGS3_G1, the SGD lines SGD0_G0 to SGD3_G0 and SGD0_G1 to SGD3_G1 are transferred to the word lines WL0 to WL15 and the selection gate lines SGSL and SGDL in the selected memory block MB, through the transfer transistor TTr in the selected memory block MB.

In the following description and the drawings, the CG lines CG0_G0 to CG15_G0 may be collectively referred to as CG0_G0, and the CG lines CG_G1 to CG15_G1 may be collectively referred to as CG_G1. Similarly, the SGS lines SGS0_G0 to SGS3_G0 may be collectively referred to as SGS line SGS_G0, and the SGS lines SGS0_G1 to SGS3_G1 may be collectively referred to as SGS line SGS_G1. Further, the SGD lines SGD0_G0 to SGD3_G0 may be collectively referred to as SGD line SGD_G0, and SGD lines SGD0_G1 to SGD3_G1 may be collectively referred to as SGD line SGD_G1.

Each block selection signal BSEL is output from the corresponding block selection signal BSEL in the row decoder 2. In other words, the row decoder 2 includes block decoders 2a_0 to 2a_m. The block decoders 2a_0 to 2a_m respectively output the block selection signals BSEL0 to BSELm. The block decoders 2a_0 to 2a_m have substantially the same elements and connections, and the block decoders 2a_0 to 2a_m are each configured to output one valid (high level) block selection signal BSEL which is determined according to the received block address signal RADD. A detailed description will follow.

The block decoder 2a_0 includes a p-type metal oxide semiconductor field effect transistor (MOSFET) T1_0, a set of a plurality of n-type MOSFETs T2_0 which are connected in series, and an n-type MOSFET T3_0. The transistor T1_0, the set of transistors T2_0, and the transistor T3_0 are connected in series in this order between a power node and a ground (common potential) node. The transistors T1_0 and T3_0 receive a signal RDEC in the gates. The signal RDEC is an enable signal of block address decoding, and supplied from, for example, the control circuit 5 and the core driver 9. The signal RDEC is set to a low level while the block selection signal BSEL_0 is disabled, and set to a high level (valid logic) when the block selection signal BSEL_0 is enabled. The set of transistors T2 receive different block address signal components in respective gates. The block address signal components each constitute a portion of the block address signal RADD (for example, one bit). The block address signal RADD is supplied from the address-command register 7, and includes information for specifying one memory block MB (for example, bit sequence). If the received block address signal RADD specifies the memory block MB_0, the entire set of transistors T2_0 is turned on. The connection node n0_0 of the transistors T1_0 and T2_0 is connected to the power node through the p-type MOSFET T4_0, and connected to the input of the inverter INV_0. The output n1_0 of the inverter INV_0 is supplied to the gate of the transistor T4_0 and functions as a signal BSELY through the level shifter LS_0. The node n0_0 is connected to the ground node through the n-type MOSFETs T5_0 and T6_0 which are connected in series.

Similarly and more generally for the memory block MB_Y, where Y greater than 1, the block decoder 2a_Y includes a p-type MOSFET T1_Y, a set of a plurality of n-type MOSFETs T2_Y which are connected in series, and an n-type MOSFET T3_Y. The transistor T1_Y, the set of transistors T2_Y, and the transistor T3_Y are connected in series in this order between the power node and the ground (common potential) node. The transistors T1_Y and T3_Y receive the signal RDEC in the gates. The set of transistors T2_Y receive different block address signal components in respective gates. If the received block address signal RADD specifies the memory block MB_Y, the entire set of transistors T2_Y is turned on. The connection node n0_Y of the transistors T1_Y and T2_Y is connected to the power node through the p-type MOSFET T4_Y, and connected to the input of the inverter INV_Y. The output n1_Y of the inverter INV_Y is supplied to the gate of the transistor T4_Y and functions as a signal BSELY through the level shifter LS_Y. The node n0_Y is connected to the ground node through the n-type MOSFETs T5_Y and T6_Y which are connected in series, and connected to the ground node through the n-type MOSFETs T7_Y and T8_Y which are connected in series. However, the memory block MB_m (where m represents the largest Y) does not include the transistors T5 and T6.

The transistors T5_Y and T7_Y of the block decoder 2a_Y of an even number Y (that is, Y=2n, where n is 0 or a natural number) receive a signal SideO in the gates. The transistors T5_Y and T7_Y of the block decoder 2a_Y of an odd number Y (that is, Y=2n+1, where n is 0 or a natural number) receive a signal SideE in the gates. The signals SideO and SideE are supplied from, for example, the core driver 9. The semiconductor memory device 10 has, for example, a leakage detection mode. In the leakage detection mode, the leakage detection circuit 11 instructs the core driver 9 to operate in the leakage detection mode. For example, the leakage detection mode is specified using a command through the input/output circuit 6 from the memory controller 20. In the leakage detection mode, the core driver 9 receives the block address signal RADD from the address-command register 7, and recognizes the memory block MB specified by the block address signal RADD. If the specified memory block MB has an even number, the core driver 9 outputs a signal SideE of valid logic level (e.g., high level), whereas if the specified memory block MB has an odd number, the core driver 9 outputs a signal SideO of valid logic level (e.g., high level).

The gates of transistors T6 and T8 in each block decoder 2a are connected to the nodes n1 of the adjacent block decoders 2a. In other words, the gates of transistors T6_1 and T8_1 of the memory block MB_1 are respectively connected to the node n1_2 of the memory block MB_2 and the node n1_0 of the memory block MB_0. Similarly and more generally, the gates of transistors T6_Y and T8_Y of the memory block MB_Y are respectively connected to the node n1_(Y+1) of the memory block MB_(Y+1) and the node n1_(Y-1) of the memory block MB_(Y-1).

Figure 5:
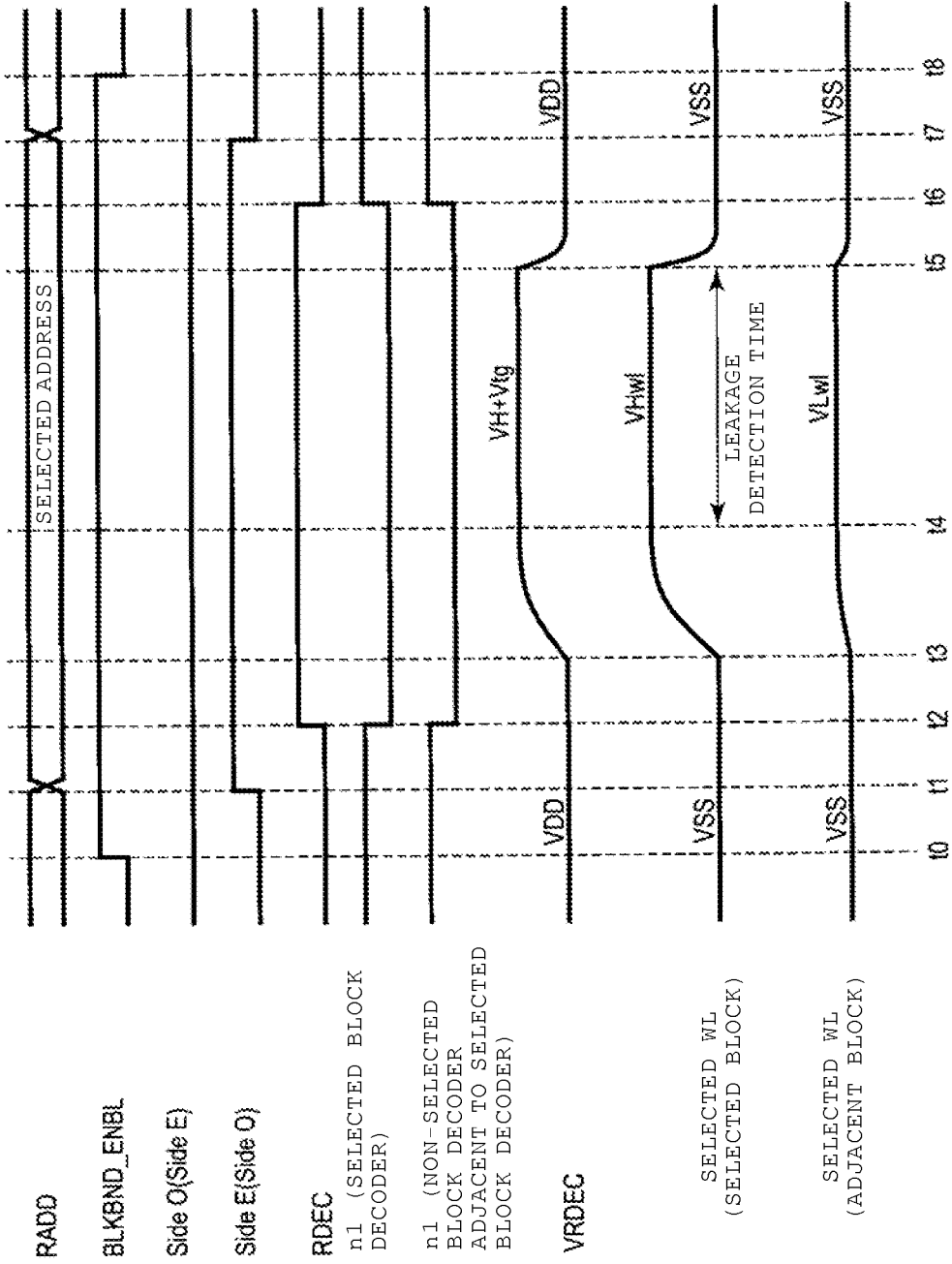
FIG. 5 is a timing chart of signals at some nodes of the semiconductor memory device according to the first embodiment.

The row decoder 2 operates as follows during leakage detection (in the leakage detection mode). FIG. 5 is a timing chart of signals at some nodes of the semiconductor memory device according to the first embodiment. While the row decoder 2 is disabled, the signal RDEC is at low level, and the nodes n0_0 to n_m are all at high levels. At time t0, the semiconductor memory device 10 receives the execution command of the leakage detection mode from the memory controller 20 or the memory tester, and thus the control circuit 5 outputs the signal BLKBND_ENDL of high level instructing the transition to the leakage detection mode.

At time t1, the semiconductor memory device 10 receives the block address signal RADD. In this example, the block address signal RADD specifies the block decoder 2a_0. Although the block address signal RADD is supplied to all block decoders 2a_0 to 2a_m, the entire set of transistors T2_0 in only the selected block decoder 2a_0 are turned on. Further, at the same time, from the block address signal RADD, the core driver 9 recognizes that the selected block decoder 2a_0 has an even number. Based on the recognition, the core driver 9 causes the signal SideE to become high level and maintains the signal SideO at low level. On the other hand, if the selected block decoder 2a has an odd number, the signal SideO becomes high level. FIG. 5 also shows the reverse case where the signal SideO is at high level by denoting the names of the depicted signals within parenthesis. In addition, the signals SideO and SideE do not become high level, upon a normal block selection (for reading, writing, or the like).

At the start of the operation of the row decoder 2, at time t2, the signal RDEC is at high level, and thus the transistors T1_0 to T1_m are turned off and the transistors T3_0 to T3_m are turned on. As described above, the entire set of transistors T2_0 in only the block decoder 2a_0 are turned on, and thus the node n0_0 becomes low level. In each of the transistor sets T2_0 to T2_m of the remaining block decoders 2a_1 to 2a_m, there is at least one transistor T2 among the entire set that is maintained off, and thus all nodes n0_1 to n0_m are maintained at high level. By the transition to the low level of the node n0_0 of the block decoder 2a_0, the node n1_0 of the block decoder 2a_0 becomes high level. Accordingly, the block selection signal BSEL0 changes to high level and the memory block MB_0 is selected.

Further, when the node n0_0 is of low level, the transistor T8_1 of the adjacent block decoder 2a_1 receives a signal of high level in the gate thereof and is turned on. As described above, since the signal SideE is at high level, the transistors T5_1 and T7_1 of the block decoder 2a_1 adjacent to the block decoder 2a_0 receive a signal SideE of high level in the gates thereof and are turned on. When the transistors are turned on or off as described above, a current path is formed between the node n0_1 and the ground node in only the adjacent block decoder 2a_1, in addition to the block decoder 2a_0 that is directly selected by the block address signal RADD, and the node n0_1 becomes low level. By the transition to the low level of the node n0_1 of the adjacent block decoder 2a_1, the node n1_1 of the block decoder 2a_1 becomes high level. Accordingly, the block selection signal BSEL changes to the high level, and the memory block MB_1 is selected. Even if the node n1_1 of the block decoder 2a_1 becomes high level, it is noted that the node n0_2 of the adjacent block decoder 2a_2 is maintained at high level. That is because the transistors T5_2 and T7_2 are maintained at off. Thus, only the memory blocks MB_0 and MB_1 are selected, and other memory blocks MBs are maintained at a non-selected state.

The signal VRDEC, the word line WL in the selected block MB and the word line WL in the non-selected block MB in FIG. 5 will be described later.

The memory blocks MB other than the memory block MB_0 operate on the same principle. In other words, when the semiconductor memory device 10 receives the block address signal RADD specifying the block decoder 2a_Y, if Y is an odd number, the signal SideO becomes high level, whereas if Y is an even number, the signal SideE becomes high level. If the signal RDEC is at high level, the node n0_Y of only the block decoder 2a_Y becomes low level. Thus, the memory block MB_Y is selected. Further, when the node n0_Y is of low level, the transistor T8_(Y+1) of the adjacent block decoder 2a_(Y+1) and the transistor T6_(Y-1) of the adjacent block decoder 2a_(Y-1) receive the signal of high level in the gates thereof, and thus are turned on. The signal SideO or the signal SideE becomes high level, and therefore, the transistors T5 and T7 are turned on in the block decoders (here, the adjacent block decoders 2a_(Y-1) and 2a_(Y+1) are included) of the odd/even number group different from the odd/even number group to which the block decoder 2a selected by the block address signal RADD belongs. By the transistors being turned on or off as described above, in addition to the block decoder 2a_Y directly selected by the block address signal RADD, only adjacent block decoders 2a_(Y-1) and 2a_(Y+1) output the block selection signals BSEL (Y-1) and BSEL (Y+1) of high level and the memory blocks MB_(Y-1) and MB_(Y+1) are selected.

In the case of selecting the block selection signal BSEL_m of the maximum number, the description above for the block MB_Y may be applied, except that only one adjacent block MB(m-1) is additionally selected.

Thus, the memory block MB adjacent to the memory block MB which is directly selected by the block address signal RADD is selected according to the first embodiment. Accordingly, based on this fact, a leakage current may be detected by using any feasible method. In other words, a potential difference is applied between two elements, which are objects of the detection of the leakage current and should be independent without any defects, and a current flowing therebetween is measured. The leakage current detection circuit 11 is configured to perform the adopted leakage current detection. Below, examples of voltages applied to some elements for leakage current detection are shown.

Figure 6:
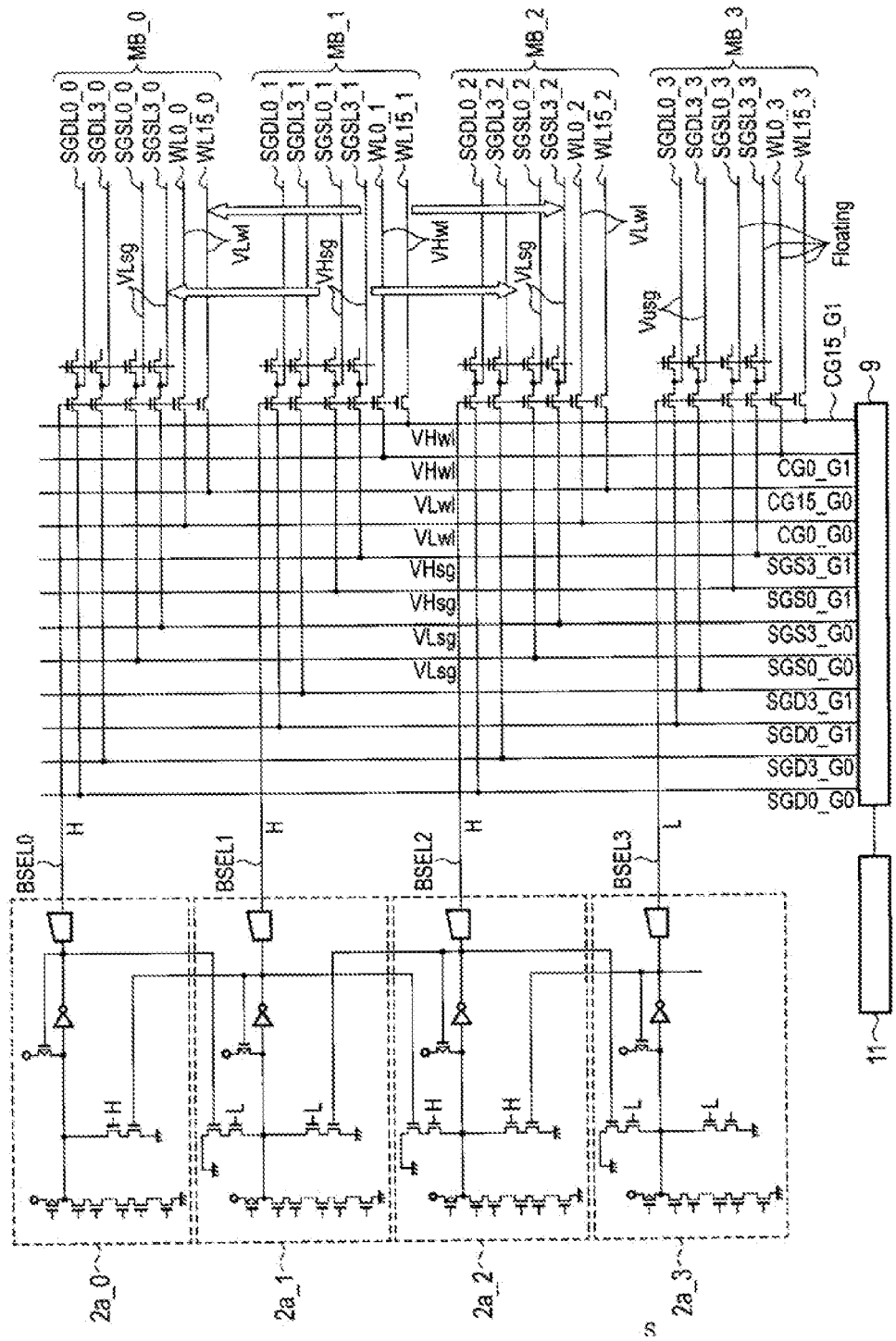
FIG. 6 shows examples of voltages at some nodes for leakage current detection in the semiconductor memory device according to the first embodiment.

FIG. 6 shows examples of voltages at some nodes for leakage current detection in the semiconductor memory device according to the first embodiment, and is based on the elements and connections of FIG. 4. FIG. 6 shows an example in which the block address signal RADD selects the block decoder 2a_1. Further, a description will be made with reference to FIG. 5. The block address signal RADD selects the block decoder 2a_1 of an odd number, therefore, the signal SideO is at high level and the signal SideE is at low level.

As described above, up to time t2, the direct selection of the block decoder 2a by the block address signal RADD and the additional selection of the adjacent block decoder 2a are completed. In other words, as shown in FIG. 6, in addition to the block selection signal BSEL1, the block selection signals BSEL0 and BSEL2 also are at high level. Therefore, in the memory blocks MB_0, MB_1, and MB_2, all transfer transistors TTr are turned on. This enables the selection gate lines SGDL and SGSL, and the word line WL to receive respectively the voltages of the SGD line SGD, the SGS line SGS, and the CG line CG which are connected through the transfer transistor TTr, only in the memory blocks MB_0, MB_1, and MB_2.

At time t3, the core driver 9 applies a voltage VHwl to one set of the CG lines for an even group CG0_G0 to CG15_G0 (CG line set CG_G0) or the CG lines CG0_G1 to CG15_G1 for an odd group (CG line set CG_G1), and applies a voltage VLwl to the other set thereof. The voltage VHwl is at higher than the voltage VLwl. FIG. 4 shows an example in which the CG line set CG_G1 receives a high voltage VHwl. Further, at time t3, the core driver 9 drives a signal VRDEC from the voltage Vdd to the voltage VHwl+Vtg. The signal VRDEC is a signal to be supplied to the level shifter LS.

By the voltage application as described above, at time t4, the word lines WL0_1 to WL15_1 of the memory block MB_1 all have the voltage VHwl, and the word lines WL0_0 to WL15_0 and WL0_2 to WL15_2 of the memory blocks MB_0 and MB_2 are all driven by the voltage VLwl. Thus, a potential difference is generated in each pair of word lines which are adjacent to each other across the memory block MB, even in any one of two boundaries of the memory block MB_1. The arrows in FIG. 6 show the level of voltage, and show that the element on the side towards the tip of the arrow has a voltage on the low side. By the generated potential difference, the leakage detection circuit 11, from time t4 to time t5, detects whether a current flows between each pair of word lines which are adjacent to each other across the memory block MB, and compares it to a certain amount of reference current. In addition, since the transfer transistor TTr is turned off in the memory block MB other than the memory blocks MB_0 to MB_2, the word lines WL0 to WL15 are in an electrically floating state. If the dummy word lines WLDS and WLDD are provided, the voltage VHwl or VLwl is applied to the dummy word lines WLDS and WLDD on the same principal as in the word lines WL0 to WL15. If the leakage detection is completed, at time t5, the core driver 9 causes the signal VRDEC to return back to the voltage VDD and separates the word line WL from the CG line so as to cause the word line WL to be discharged to VSS. Further, if the word line WL is discharged, at time t6, the core driver 9 causes the signal RDEC to be at low level and deactivates the row decoder 2; therefore in all block decoders 2a, the node n0 returns back to high level. Next, if the leakage detection is performed in other block boundaries, a new block address signal RADD is supplied to the core driver 9, and the operations from time t1 to t7 are repeated. If the leakage detection is completed, the core driver 9 receives the signal BLK-BD_ENBL of low level and terminates the leakage detection mode. Thus, a series of leakage detections including the direct selection of the block decoder 2a by the block address signal RADD and the additional selection of the adjacent block decoder are completed.

Depending on the detection method according to the leakage detection circuit 11, the leakage current detection may be performed at each word line WL separately. In other words, for example, the voltage VHwl or VLwl is applied only to a word line WL of a single number (for example, word line WL0), then the voltage VHwl or VLwl is applied to another word line WL, and this application is repeated for each word line WL.

Further, the leakage current for the selection gate line SGSL in addition to the word line WL may be detected. In other words, the core driver 9 applies the voltage VHsg to one of a set of SGS lines for an even group SGS0_G0 and SGS3_G0 and a set of SGS lines for an odd group SGS0_G1 and SGS3_G1, and applies the voltage VLsg to the other of the sets. The voltage VHsg is higher than the voltage VLsg. By this application, a potential difference is generated between the selection gate line SGLS3 of the memory block MB_0 and the selection gate line SGSL0 of the memory block MB_1, and between the selection gate line SGSL3 of the memory block MB_1 and the selection gate line SGSL0 of the memory block MB_2.

As shown in FIGS. 3 and 4, the example of the leakage current detection for the selection gate line SGSL is shown based on the configuration where the selection gate line SGDL is not located at the end of the memory block MB but the selection gate line SGSL is located at the end of the memory block MB. However, if the selection gate line SGSL is not located at the end of the memory block MB but the selection gate line SGDL is located at the end of the memory block MB, the leakage current for the selection gate line SGDL may be detected. In such as case, the core driver 9 applies the voltage VHsg to one of a set of SGD lines for an even group SGD0_G0 and SGD3_G0 and a set of SGD lines for an odd group SGD0_G1 and SGD3_G1, and applies the voltage VLsg to the other of the sets. By this application, a potential difference is generated between the selection gate line SGDL3 of the memory block MB_0 and the selection gate line SGDL0 of the memory block MB_1, and between the selection gate line SGDL3 of the memory block MB_1 and the selection gate line SGDL0 of the memory block MB_2.

The set of the memory block selection by the block address signal RADD and the adjacent memory block selection and the voltage application as described above is performed for each memory block MB to be inspected. As a result, in each memory block boundary, the combination of a potential difference generated when the memory block MB on one side has a high voltage and the memory block MB on the other side has a low voltage and the reverse (a potential difference generated when the memory block MB on one side has a low voltage and the memory block MB on the other side has a high voltage) is covered.

As described above, according to the first embodiment, the adjacent block decoder also can be additionally selected for the reception of the block address signal RADD specifying one block decoder. By using this, the additional selection of the adjacent memory block MB is possible in addition to the direct selection of the memory block MB by the block address signal RADD. Accordingly, the leakage current can be detected efficiently, by using the additional selection of the adjacent memory block MB, for example, during leakage current detection.

Second Embodiment

The second embodiment relates to an example for block selection in the leakage detection in an example in which a block address signal RADD having a certain value leads to the selection of two memory blocks.

Figure 7:
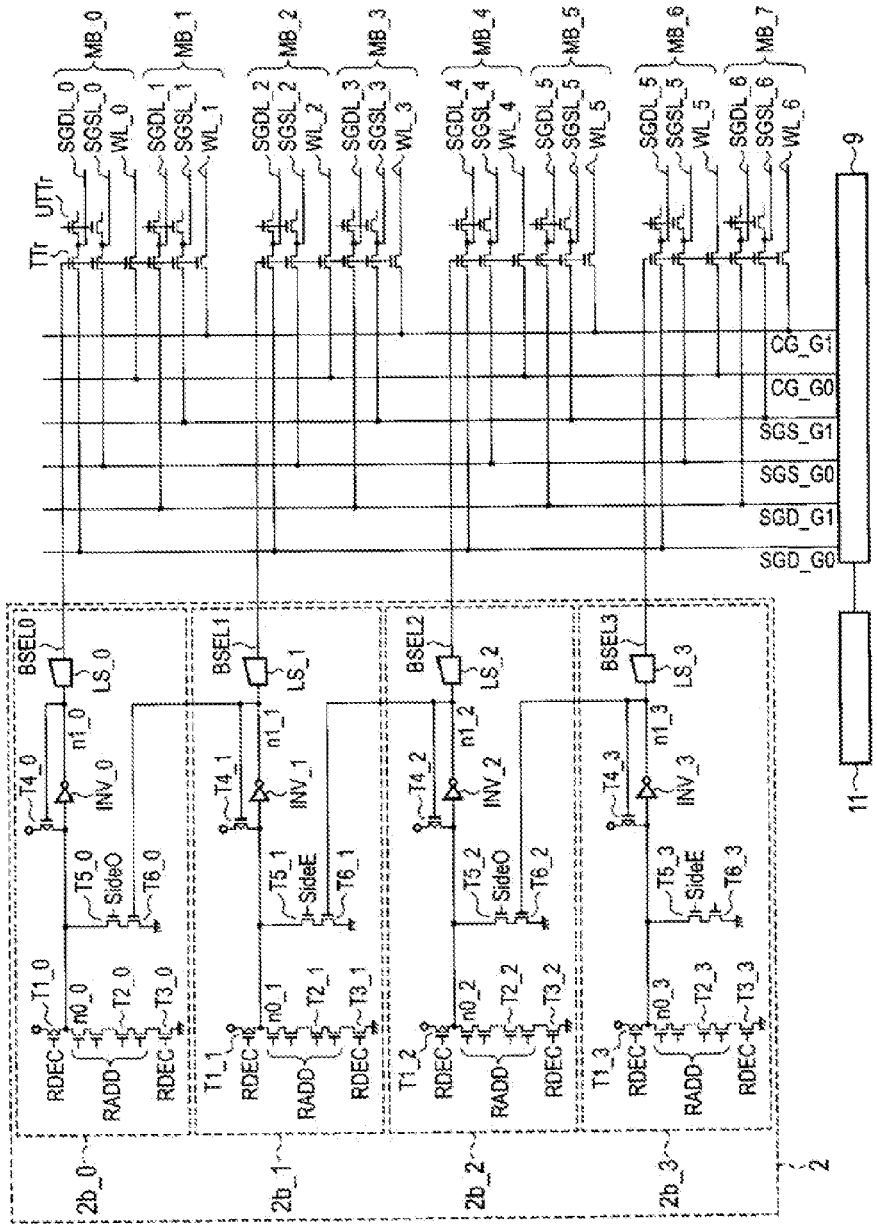
FIG. 7 is a circuit diagram of a portion of a semiconductor memory device according to a second embodiment.

FIG. 7 is a circuit diagram of a portion of a semiconductor memory device according to the second embodiment. Specifically, FIG. 7 shows a portion of the memory cell array 1, a portion of the row decoder 2, and associated functional blocks. As shown in FIG. 7, the row decoder 2 includes block decoders 2b_0, 2b_1, 2b_2, 2b_3, . . . , 2b_((m−1)/2). Each block decoder 2b includes the same elements as the block decoder 2a (see FIG. 4) except that there are no transistors T7 and T8. In other words, a block decoder 2b_Z includes transistors T1_Z, T2_Z, and T3_Z which are connected in series, and transistors T4_Z, T5_Z, and T6_Z. However, the block decoder 2b is different from the block decoder 2a in the way it is turned on based on the block address signal RADD. In other words, if the block address signal RADD specifying the memory block MB_0 or MB_1 is received, the block decoder 2b_0 is configured such that all transistors T2_0 are turned on. Similarly, when the block address signal RADD specifying the memory block MB_(2Z) or MB_(2Z+1) is received, the block decoder 2b_Z is configured to turn on the all transistors T2_Z.

The gate of the transistor T6_0 of the block decoder 2b_0 is connected to the node n1_1 of the block decoder 2b_1. Similarly, the gate of the transistor T6_Z of the block decoder 2b_Z is connected to the node n1_(Z+1) of the block decoder 2b_(Z+1).

The transistor T5_Z of the block decoder 2b_Z of even number Z receives the signal SideO in the gate thereof. The transistor T5_Z of the block decoder 2b_Z of odd number Z receives the signal SideE in the gate thereof.

The block selection signal BSEL0 of the block decoder 2b_0 is connected to the gates of all transistors TTr of the memory blocks MB_0 and MB_1. Accordingly, the block selection signal BSEL0 of high level selects the memory blocks MB_0 and MB_1. Similarly, the block selection signal BSELZ of the block decoder 2b_Z is connected to the gates of all transistors TTr of the memory blocks MB_2Z and MB_2Z+1. Accordingly, the block selection signal BSELZ of high level selects the memory blocks MB_2Z and MB_(2Z+1). In this manner, two memory blocks MB_(2Z) and MB_(2Z+1) specified by the block decoder 2b_Z constitute a pair.

In addition, in FIG. 7, only one CG line CG_G0 or CG_G1 is shown for each CG line set, and only one word line WL is shown for each memory block. Further, only one SGD line SGD_G0 or SGD_G1 is shown for each SGD line set, and only one SGS line SGS_G0 or SGS_G1 is shown for each SGS line set. Further, only one source-side selection gate line SGSL and one drain-side selection gate line SGDL are shown for each memory block.

The row decoder 2 in FIG. 7 operates as follows during the leakage detection (in the leakage detection mode). When the row decoder 2 receives a block address signal RADD that leads to the selection of the block decoder 2b_1, that is, the block address signal RADD defining the memory block MB_2 or MB_3, only the block decoder 2b_1 outputs the block selection signal BSEL1 of high level by the same operation as in the description regarding the block decoder 2a of the first embodiment. Thus, the memory blocks MB_2 and MB_3 are selected. Further, by the node n0_1 of low level, the transistor T6_0 of the adjacent block decoder 2b_0 receives a signal of high level in the gate thereof and is turned on. Further, the block decoder 2b_1 belongs to the odd number group, and therefore, the transistor T5_0 of the adjacent block decoder 2b_0 receives a signal SideO of high level in the gate thereof and is turned on. By being turned on or off as described above, in addition to the block decoder 2b_1 directly selected by the block address signal RADD, the adjacent block decoder 2b_0 also outputs the block selection signal BSEL0 of high level, and thus the memory blocks MB_0 and MB_1 are selected.

Similarly and more generally, when the row decoder 2 receives a block address signal RADD that leads to the selection of the block decoder 2b_Z, that is, the block address signal RADD defining the memory blocks MB_2Z or MB_(2Z+1), only the block decoder 2b_Z outputs the block selection signal BSELZ of high level. Thus, the memory blocks MB_2Z and MB_(2Z+1) are selected. Further, by the node n0_Z of low level, the transistor T6_(Z−1) of the adjacent block decoder 2b_(Z−1) receives a signal of high level in the gate thereof and is turned on. Further, if Z directly selected by the block address signal RADD is an odd number, the signal SideO becomes high level, whereas if Z is an even number, the signal SideE becomes high level. In other words, the transistor T5 is turned on in the block decoder 2b of the odd/even number group that is different from the odd/even number group to which the block decoder 2b directly selected by the block address signal RADD belongs. By being turned on or off as described above, in addition to the block decoder 2b_Z directly selected by the block address signal RADD, the adjacent block decoder 2b_(Z−1) also outputs the signal BSEL (Z−1) of high level, and thus the memory blocks MB_(2(Z−1)−2) and MB_(2(Z−1)−1) are selected.

Thus, the memory block pair adjacent to the memory block pair directly selected by the block address signal RADD is additionally selected according to the second embodiment, and thus it is possible to detect the leakage current by using any feasible method. Examples of voltages applied to some elements for the leakage current detection are shown below.

Figure 8:
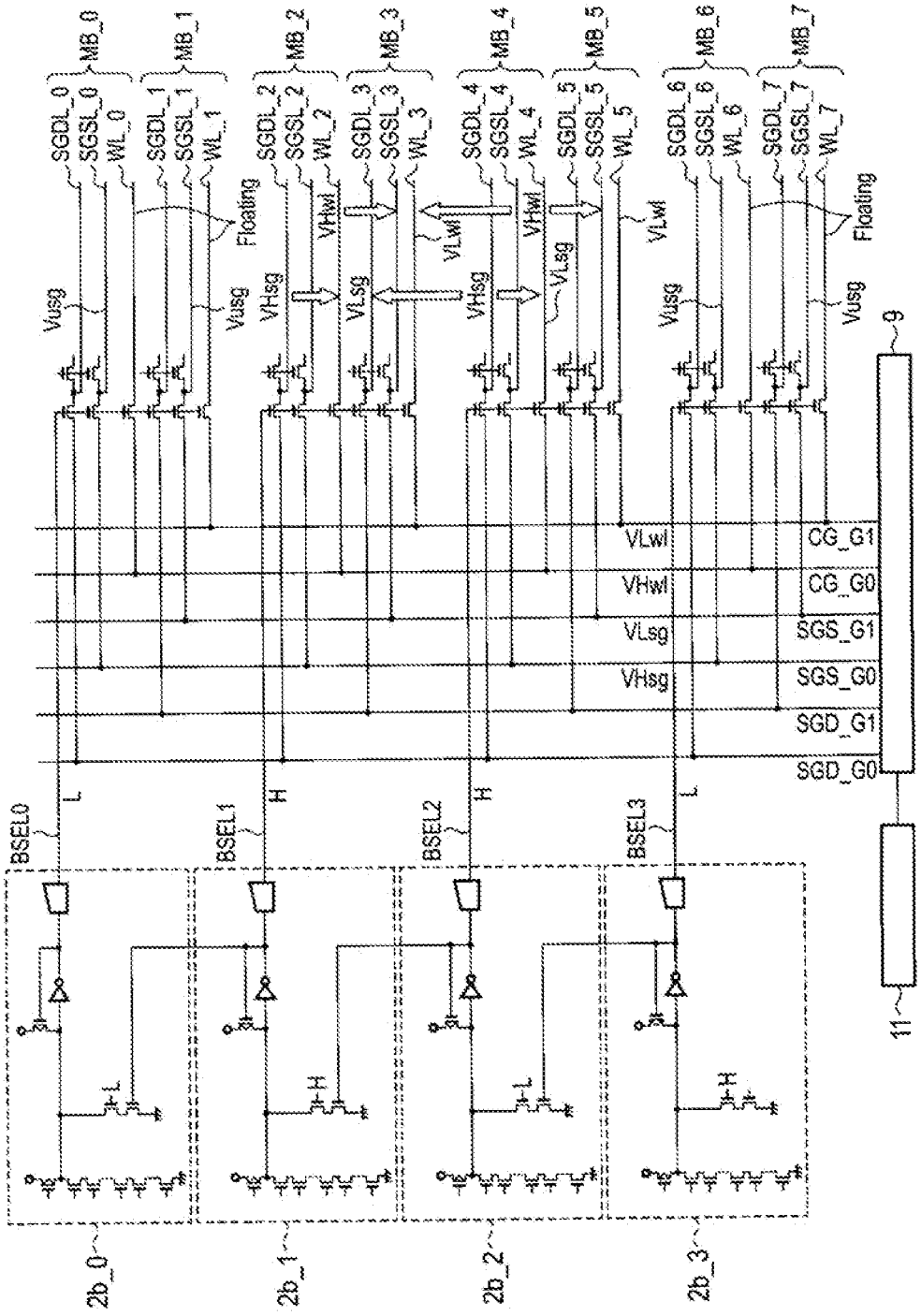
FIG. 8 shows examples of voltages at some nodes for leakage current detection in the semiconductor memory device according to the second embodiment.

FIG. 8 shows examples of voltages at some nodes for leakage current detection in the semiconductor memory device according to the second embodiment, and is based on the element and connections of FIG. 7. FIG. 8 shows an example in which the block address signal RADD selects the block decoder 2b_2. As shown in FIG. 8, the core driver 9 applies a voltage VHwl and a voltage VLwl to one set and the other set of the CG line set for even group CG_G0 and the CG line set for odd group CG_G1. FIG. 8 shows an example in which the CG line set CG_G0 receives a high voltage VHwl. By this application, the word line group WL_4 of the memory block MB_4 is driven by the high voltage VHwl, and the word line group WL_5 of the memory block MB_5 is driven by the low voltage Lwl. In other words, a potential difference is generated in each word line pair which is arranged across the boundary of one memory block pair MB_4 and MB_5.

Further, in addition to the block decoder 2b_2 directly selected by the block address signal RADD, the block decoder 2b_1 also outputs the block selection signal BSEL_1 of high level. As a result, the memory block pair MB_2 and MB_3 are selected, the word line group WL_2 of the memory block MB_2 is driven to a high voltage VHwl, and the word line group WL_3 of the memory block MB_3 is driven to a low voltage VLwl. Accordingly, the potential difference is generated also in each word line pair which is arranged across the boundary of the memory blocks MB_2 and MB_3. Further, the potential difference is generated also in each word line pair which is arranged across the boundary of the memory blocks MB_3 and MB_4 which belong to different memory block pairs. The leakage current is detected by utilizing these potential differences.

The remaining blocks MB_0, MB_1, and MB_6 to MB_m are non-selected, and those word line groups WL are in an electrically floating state.

Similarly to the first embodiment, the leakage current for the selection gate lines SGSL and SGDL may be detected. In other words, as described above, two memory block pairs are selected, as described in the first embodiment, the core driver 9 applies the voltage VHsg to one of a set of SGS lines for an even group SGS0_G0 and SGS3_G0 and a set of SGS lines for an odd group SGS0_G1 and SGS3_G1, and applies the voltage VLsg to the other of the sets. By this application, a potential difference is generated between the selection gate lines SGSL0 and SGSL3 which are arranged across the two selected memory block pairs. Otherwise, the core driver 9 applies the voltage VHsg to one of a set of SGD lines for an even group SGD0_G0 and SGD3_G0 and a set of SGD lines for an odd group SGD0_G1 and SGD3_G1, and applies the voltage VLsg to the other of the sets. By this application, a potential difference is generated between the selection gate lines SGDL0 and SGDL3 which are arranged across the two selected memory block pairs.

Figure 9:
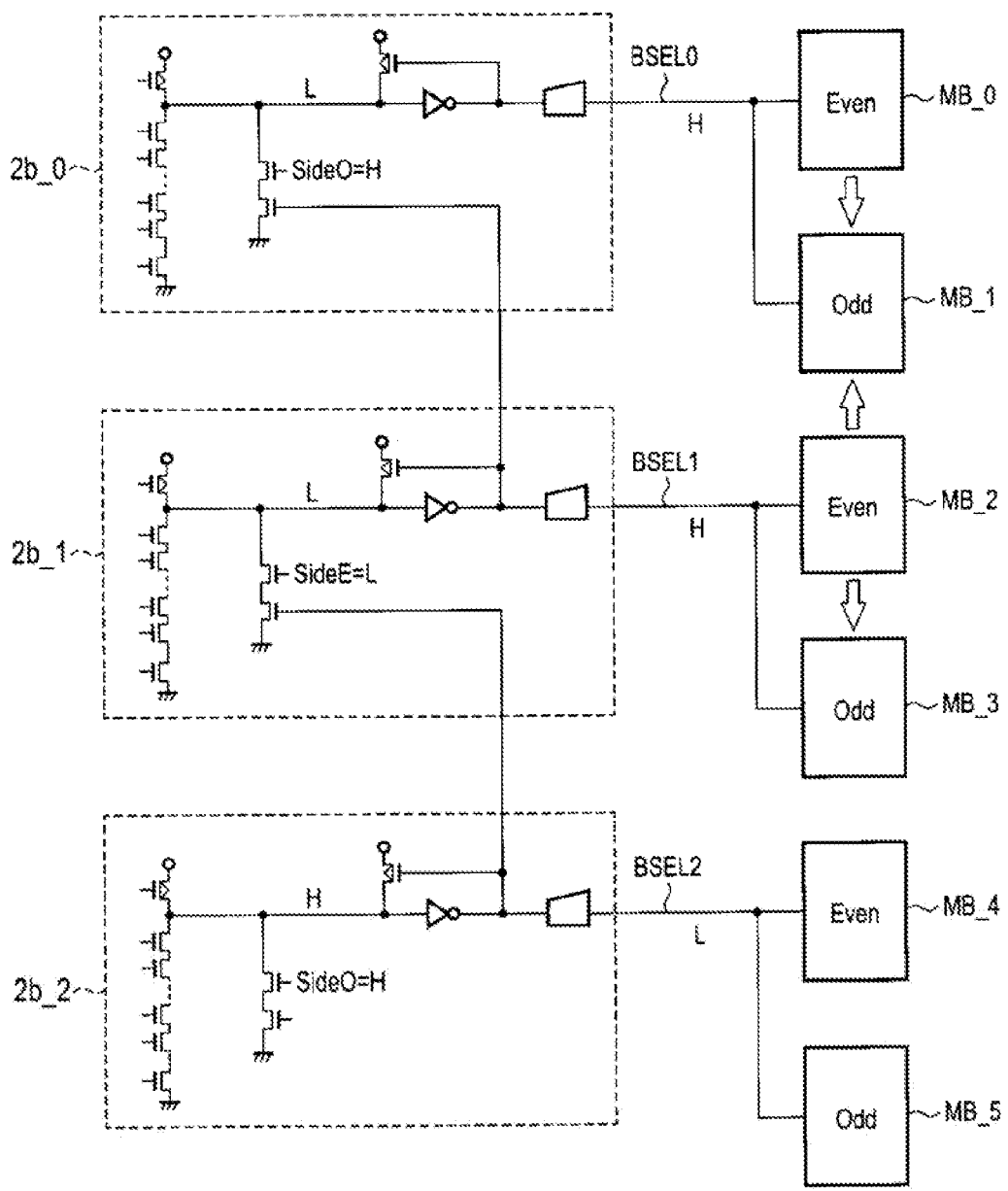
FIG. 9 shows examples of voltages at some nodes for leakage current detection according to the second embodiment.
Figure 10:
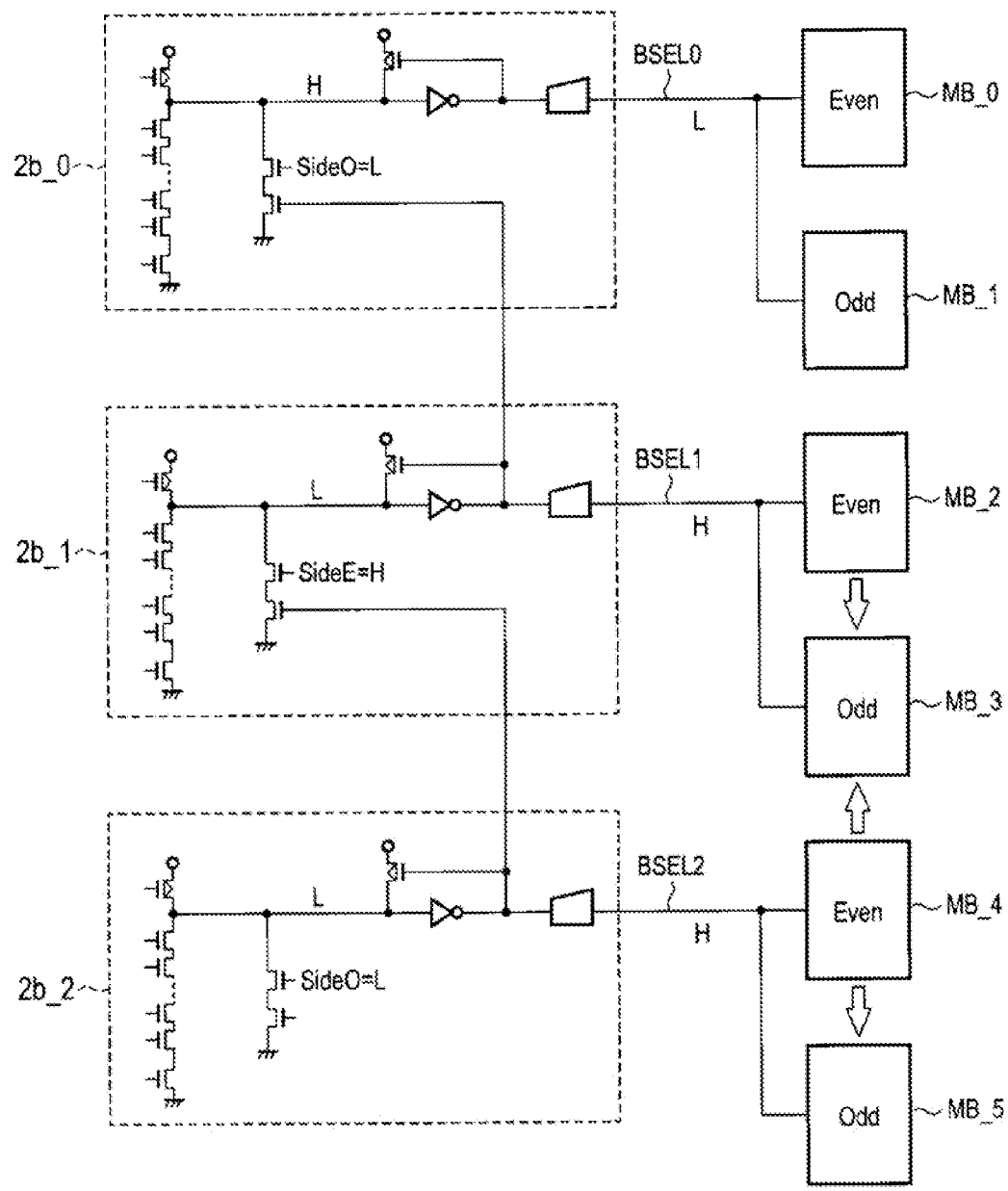
FIG. 10 shows examples of voltages at some nodes for leakage current detection according to the second embodiment.

The set of the direct selection of the memory block pair by the block address signal RADD and the additional selection of the adjacent memory block pair and the voltage application as described above is performed for each memory block pair to be inspected. Depending on whether Z of the block decoder 2b_Z selected by the block address signal RADD is an odd number or an even number, as shown in FIGS. 9 and 10, the signal SideE or SideO is at high level. FIGS. 9 and 10 show examples of voltages at some nodes for leakage current detection in the leakage current detection according to the second embodiment. FIGS. 9 and 10 respectively show a case where Z is an odd number and a case where Z is an even number. In addition, FIGS. 8 to 10 all show a case in which the CG line set CG_G0 receives the high voltage VHwl and the CG line set CG_G1 receives the low voltage VLwl. Therefore, the memory block MB_Y of an even number receives a higher voltage than the memory block MB_Y of an odd number Y. Such a set of the direct selection of the memory block pair by the block address signal RADD and the additional selection of the adjacent memory block pair and the voltage application is performed for each memory block MB to be inspected. As a result, a potential difference in the direction from the memory block MB_Y of the even number Y towards the memory block MB_Y of the odd number Y is covered in each memory block boundary.

Further, in some cases, it is desirable to inspect a case where the direction of the voltage in the memory block boundary is reversed. In this case, the high voltage VHwl is applied to the CG line set CG_G1, and each memory block pair is sequentially selected while the CG line set CG_G0 is driven to the low voltage VLwl. By doing so, a combination in which voltages in both directions are applied in each memory block boundary will be covered.

Figure 11:
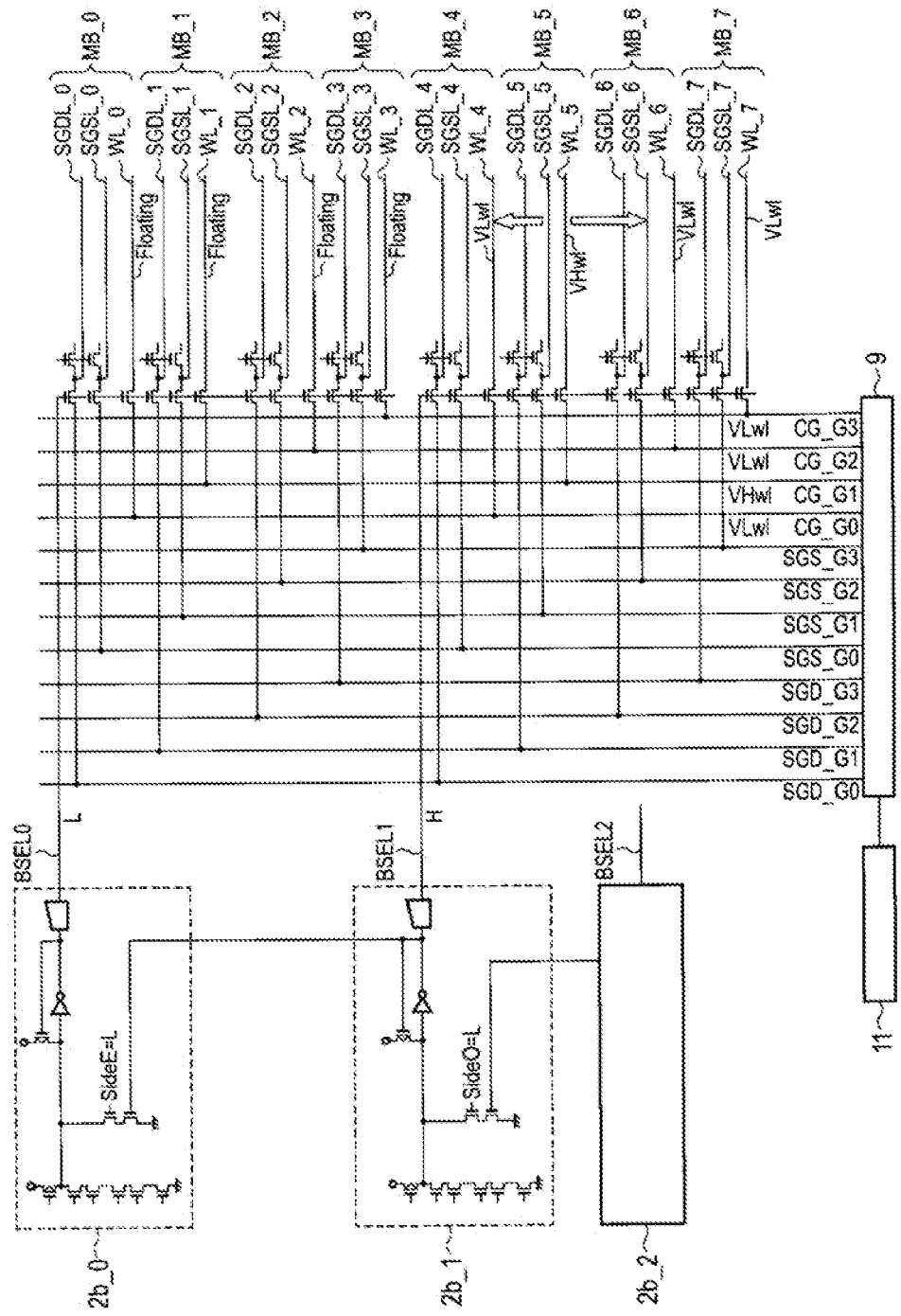
FIG. 11 is a circuit diagram of a portion of a second example of the semiconductor memory device according to the second embodiment.

Further, the second embodiment may be applied to an example in which the block address signal RADD having a certain value leads to the selection of more than two memory blocks MB. FIG. 11 is a circuit diagram of a portion of the semiconductor memory device according to a second example of the second embodiment. FIG. 11 shows an example in which the block address signal RADD having a certain value leads to the selection of four memory blocks MB. As shown in FIG. 11, the block selection signal BSEL from one block decoder 2*b* is supplied to the gate of the transfer transistor TTr of the memory blocks MB of four sequential numbers. In other words, the block decoder 2*b*_Z supplies the block selection signal BSELZ to the memory blocks MB_4Z, MB_(4Z+1), MB_(4Z+2), and MB_(4Z+3). The block decoder 2*b*_Z is configured to turn on all transistors T2_Z of the block decoder 2*b*_Z when the block address signal RADD specifying any one of the memory blocks MB_4Z, MB_(4Z+1), MB_(4Z+2), and MB_(4Z+3) is received. The memory blocks MB_4Z, MB_(4Z+1), MB_(4Z+2), and MB_(4Z+3) constitute a memory block set.

Based on that the block address signal RADD having a certain value selects four memory blocks MB, the CG lines CG are divided into four groups. In other words, the CG lines CG0_G0 to CG15_G0, CG0_G1 to CG15_G1, CG0_G2 to CG15_G2, and CG0_G3 to CG15_G3 are provided and these receive voltages from the core driver 9. Similarly, the SGS lines SGSW_G0, SGSW_G1, SGSW_G2, and SGSW_G3 are provided, and the SGD lines SGDW_G0, SGDW_G1, SGDW_G2, and SGDW_G3 are provided.

According to the elements and connections of FIG. 11, an additional selection of the adjacent memory block set is possible, in addition to the memory block set which is directly selected by the block address signal RADD. By the modification based on the principles described above, based on the selection of the memory block set that includes memory blocks MB of an arbitrary number by the block address signal RADD having a single value, the additional selection of the adjacent memory block set is possible, in addition to the direct selection of a memory block set by the block address signal RADD.

Figure 12:
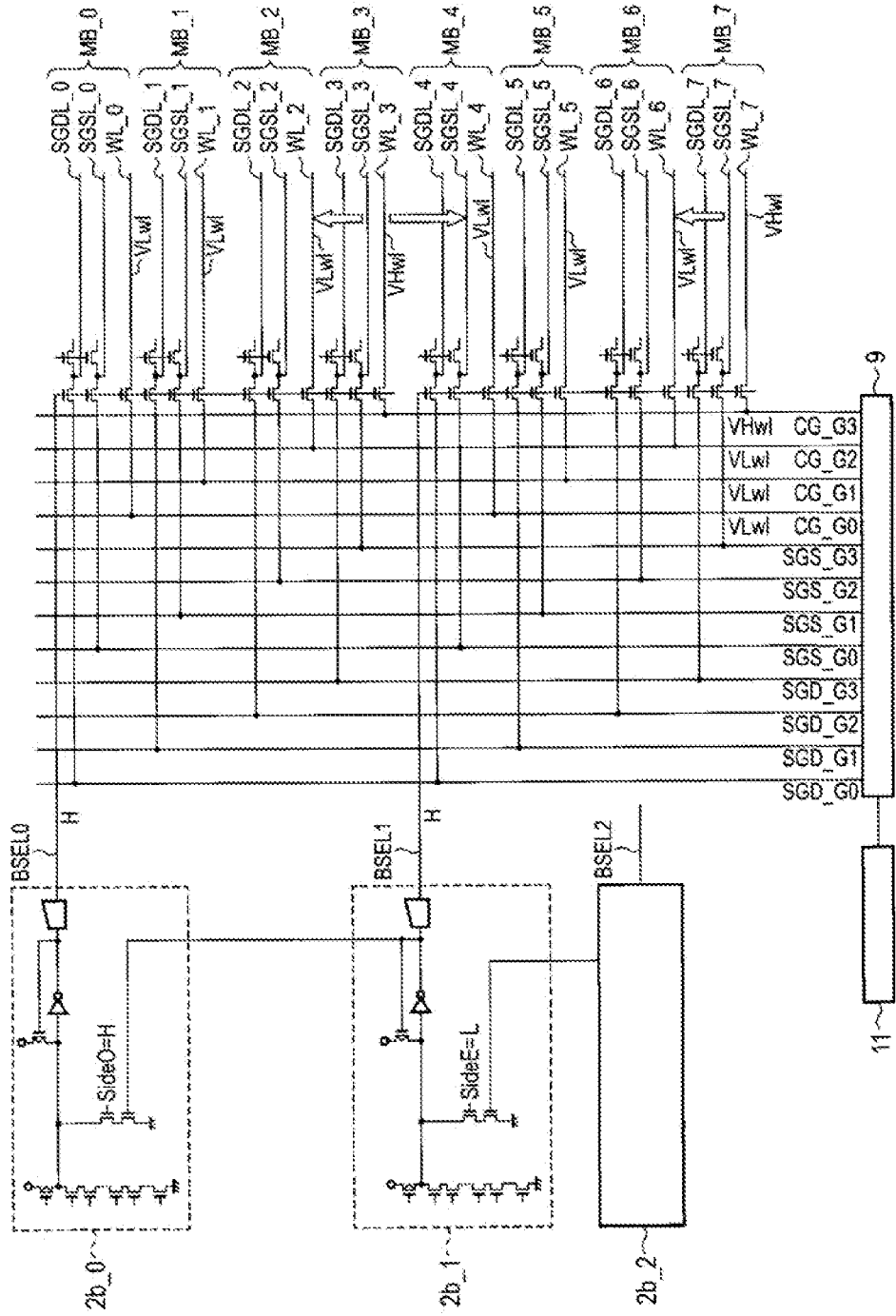
FIG. 12 shows examples of voltages at some nodes for leakage current detection in the second example of the semiconductor memory device according to the second embodiment.
Figure 13:
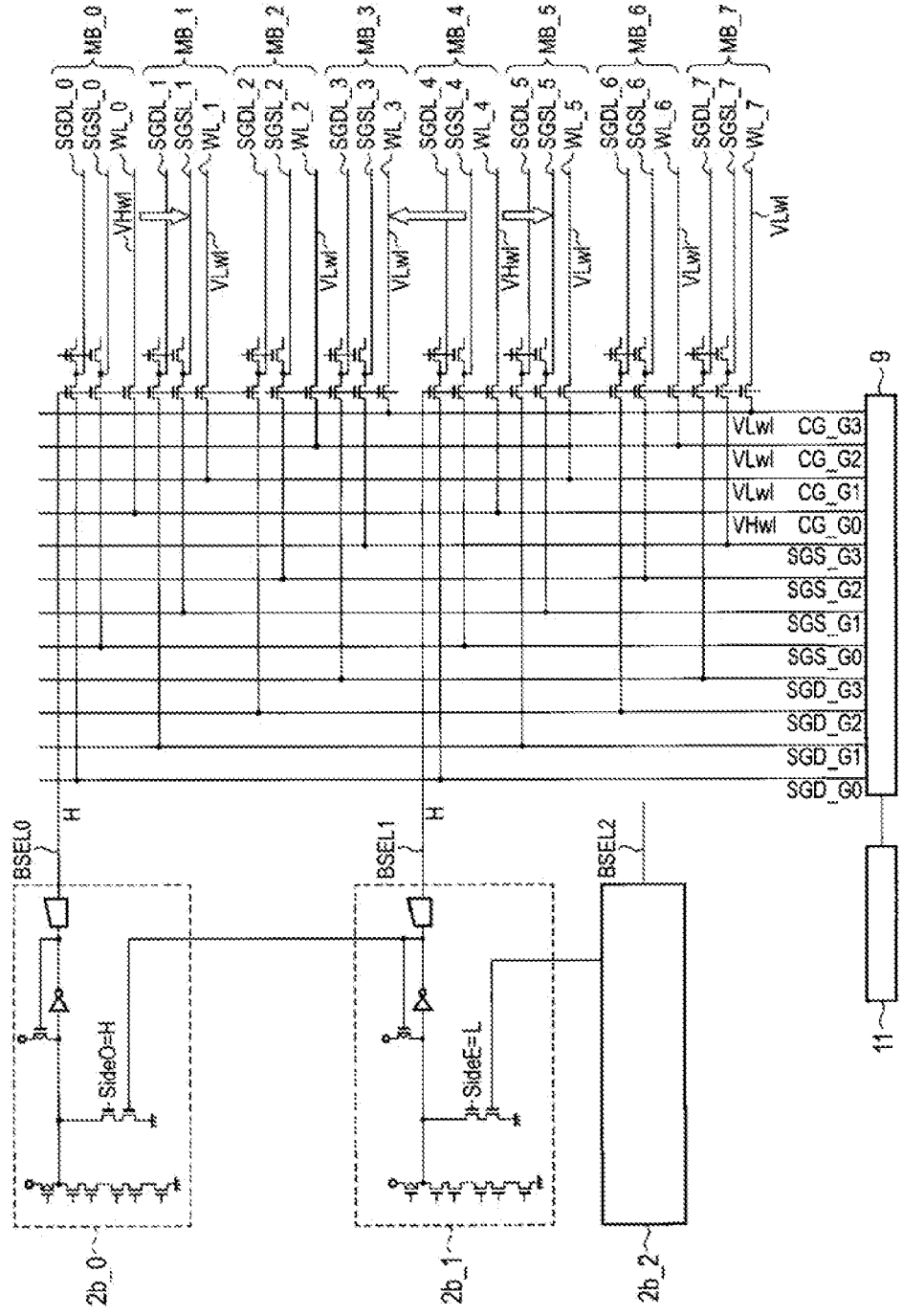
FIG. 13 shows another example of voltages at some nodes for leakage current detection in the second example of the semiconductor memory device according to the second embodiment.

For the leakage detection, any feasible method may be used as described above. An example applied to a case of FIG. 11 will be described below. FIGS. 11 to 13 respectively show examples of voltages at some nodes for leakage current detection in the semiconductor memory device according to the second example of the second embodiment. As shown in FIG. 11, a set of the memory blocks MB_4 to MB_7 is selected without another memory block set being selected. In other words, the memory blocks MB_4 to MB_7 are selected by the block selection signal BSEL1 of high level. The signals SideO and SideE also remain at low level. At the selection state, the CG line CG_G0, the CG line CG_G2, and the CG line CG_G3 are driven to the low voltage VLwl, and the CG line CG_G1 is driven to the high voltage VHwl. As a result, a potential difference is generated between the memory blocks MB_4 and MB_5, and between the memory blocks MB_5 and MB_6.

Further, as shown in FIG. 12, the SideO is at high level and the memory blocks MB_0 to MB_3 are selected, and the CG line CG_G3 is driven to the high voltage VHwl, and the CG lines CG_G0 to the CG line CG_G2 are driven to the low voltage VLwl. As a result, a potential difference is generated between the memory blocks MB_6 and MB_7 and between the memory blocks MB_2 and MB_3. Further, a potential difference is generated in the memory blocks MB in the boundary between the directly selected memory block set and the additionally selected memory block set, that is, between the memory blocks MB_3 and MB_4.

Further, as shown in FIG. 13, the SideO is at high level and the memory blocks MB_0 to MB_3 are also selected, the CG line CG_G0 is driven to the high voltage VHwl, and the CG lines CG_G1 to CG_G3 are driven to the low voltage VLwl. As a result, a potential difference is generated between the memory blocks MB_0 and MB_1, between the memory blocks MB_3 and MB_4, and between the memory blocks MB_4 and MB_5.

The potential difference, which has another magnitude relationship different from that shown in FIGS. 11 to 13, is realized by an appropriate combination of the voltages VHwl and VLwl applied to the CG line CG_G0 to the CG line CG_G3. Then, when the set of the direct selection of the memory block set, the additional selection of the adjacent memory block set and the voltage application as described above is performed for each memory block set, various combinations of potential differences in each memory block boundary are covered.

As described above, according to the second embodiment, it is possible to additionally select also the adjacent block decoder for the reception of the block address signal RADD specifying one block decoder. By doing so, in addition to the direct selection of the memory block set by the block address signal RADD, the additional selection of the adjacent memory block set is possible. Accordingly, by using the additional selection of the adjacent memory block set MB, for example, during leakage current detection, the leakage current can be efficiently detected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a plurality of memory blocks; and
a row decoder including a plurality of decoders including a first decoder and a second decoder, the first decoder being configured to output a first block selection signal for selecting one of the memory blocks and a control signal for causing the second decoder to output a second block selection signal for selecting another one of the memory blocks.

2. The device according to claim 1, wherein the memory blocks selected by the first and second block selection signals are adjacent memory blocks.

3. The device according to claim 1, wherein the second decoder includes a first switch, a gate of the first switch being configured to receive a control signal from the first decoder.

4. The device according to claim 3, wherein
the second decoder further includes a second switch connected in series with the first switch between an internal node and a ground node, the second block selection signal being generated by inverting a signal at the internal node.

5. The device according to claim 4, wherein the decoders are divided into an odd group and an even group, and the second switch is turned on when the first decoder that is outputting the first block selection signal belongs to the odd group and the second decoder belongs to the even group or when the first decoder that is outputting the first block selection signal belongs to the even group and the second decoder belongs to the odd group.

6. The device according to claim 5, wherein the second decoder further includes third and fourth switches connected in series and in parallel with the first and second switches, between the internal node and the ground node, a gate of the third switch being configured to receive a control signal from a third decoder, which is another one of the decoders, and the fourth switch being turned on when the third decoder that is outputting a third block selection signal belongs to the odd group and the second decoder belongs to the even group or when the third decoder that is outputting the third block selection signal belongs to the even group and the second decoder belongs to the odd group.

7. The device according to claim 1, wherein one of the decoders is provided for each of the memory blocks.

8. The device according to claim 1, wherein one of the decoders is provided for at least two of the memory blocks, and the first decoder is configured to output additional block selection signals for selecting additional memory blocks.

9. A memory device operable in a first mode and a second mode comprising:
  a plurality of memory blocks; and
  a row decoder including a plurality of decoders including a first decoder and a second decoder, the first decoder being configured to output a first block selection signal for selecting one of the memory blocks and a control signal for causing the second decoder to output a second block selection signal for selecting another one of the memory blocks during the second mode but not during the first mode.

10. The device according to claim 9, wherein the memory blocks selected by the first and second block selection signals are adjacent memory blocks.

11. The device according to claim 9, wherein the second decoder includes a first switch, a gate of the first switch being configured to receive the first block selection signal, and a second switch connected in series with the first switch between an internal node and a ground node, the second block selection signal being generated by inverting a signal at the internal node.

12. The device according to claim 11, wherein the decoders are divided into an odd group and an even group, and the second switch is turned on during the second mode when the first decoder that is outputting the first block selection signal belongs to the odd group and the second decoder belongs to the even group or when the first decoder that is outputting the first block selection signal belongs to the even group and the second decoder belongs to the odd group.

13. The device according to claim 12, wherein the second switch is not turned on during the first mode even when the first decoder that is outputting the first block selection signal belongs to the odd group and the second decoder belongs to the even group or when the first decoder that is outputting the first block selection signal belongs to the even group and the second decoder belongs to the odd group.

14. The device according to claim 13, wherein the second decoder further includes third and fourth switches connected in series and in parallel with the first and second switches, between the internal node and the ground node, the third switch being turned on during the second mode, but not during the normal mode.

15. The device according to claim 9, wherein one of the decoders is provided for each of the memory blocks.

16. The device according to claim 9, wherein one of the decoders is provided for at least two of the memory blocks, and the first decoder is configured to output additional block selection signals for selecting additional memory blocks.

17. A method of testing a memory device for leakage through connected lines between adjacent memory blocks, comprising:
  generating a first block selection signal and selecting a first memory block using the first block selection signal; and
  generating a second block selection signal from the first block selection signal and selecting a second memory block that is adjacent to the first memory block using the second block selection signal.

18. The method of claim 17, generating a third block selection signal from the first block selection signal and selecting a third memory block that is adjacent to the first memory block using the third block selection signal.

19. The method of claim 17, further comprising:
  selecting one or more additional memory blocks using the first block selection signal; and
  selecting one or more additional memory blocks using the second block selection signal.

20. The method of claim 17, further comprising:
  transitioning the memory device from the normal mode to the leakage detection mode prior to generating the first and second block selection signals.

* * * * *